(12) United States Patent
Blalock et al.

(10) Patent No.: US 7,321,148 B2
(45) Date of Patent: Jan. 22, 2008

(54) CAPACITOR CONSTRUCTIONS AND RUGGED SILICON-CONTAINING SURFACES

(75) Inventors: Guy T. Blalock, Boise, ID (US); Lyle D. Breiner, Meridian, ID (US); Er-Xuan Ping, Meridian, ID (US); Shenlin Chen, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 218 days.

(21) Appl. No.: 10/913,275

(22) Filed: Aug. 6, 2004

(65) Prior Publication Data

US 2005/0051827 A1   Mar. 10, 2005

Related U.S. Application Data

(62) Division of application No. 10/655,654, filed on Sep. 5, 2003, now Pat. No. 6,887,755.

(51) Int. Cl.
*H01L 27/108* (2006.01)
(52) U.S. Cl. .................... 257/306; 257/309
(58) Field of Classification Search ........... 257/296, 257/309, 306
See application file for complete search history.

(56) References Cited

U.S. PATENT DOCUMENTS

| 5,519,238 | A | * | 5/1996 | Lu ........................... 257/309 |
| 5,726,085 | A | * | 3/1998 | Crenshaw et al. .......... 438/255 |
| 5,804,481 | A | * | 9/1998 | Tseng ........................ 438/255 |
| 5,910,019 | A | | 6/1999 | Watanabe et al. |
| 5,930,625 | A | * | 7/1999 | Lin et al. ................... 438/253 |
| 5,989,969 | A | | 11/1999 | Watanabe et al. |
| 6,025,280 | A | | 2/2000 | Brady et al. |
| 6,143,620 | A | * | 11/2000 | Sharan et al. .............. 438/398 |
| 6,204,120 | B1 | | 3/2001 | Gilboa et al. |
| 6,281,138 | B1 | | 8/2001 | Brady et al. |
| 6,335,242 | B1 | * | 1/2002 | Yamazaki ................... 438/255 |
| 6,399,439 | B1 | | 6/2002 | Yamanishi et al. |
| 6,436,761 | B1 | | 8/2002 | Harada et al. |
| 2003/0129807 | A1 | | 7/2003 | Ping et al. |

FOREIGN PATENT DOCUMENTS

| JP | 2001-358317 | 12/2001 |
| KR | 0221755 | 11/1999 |
| WO | US2004/027899 | 8/2004 |

* cited by examiner

*Primary Examiner*—Tuan H. Nguyen
(74) *Attorney, Agent, or Firm*—Wells St. John

(57) ABSTRACT

The invention encompasses a method of forming a rugged silicon-containing surface. A layer comprising amorphous silicon is provided within a reaction chamber at a first temperature. The temperature is increased to a second temperature at least 40° C. higher than the first temperature while flowing at least one hydrogen isotope into the chamber. After the temperature reaches the second temperature, the layer is seeded with seed crystals. The seeded layer is then annealed to form a rugged silicon-containing surface. The rugged silicon-containing surface can be incorporated into a capacitor construction. The capacitor construction can be incorporated into a DRAM cell, and the DRAM cell can be utilized in an electronic system.

5 Claims, 6 Drawing Sheets

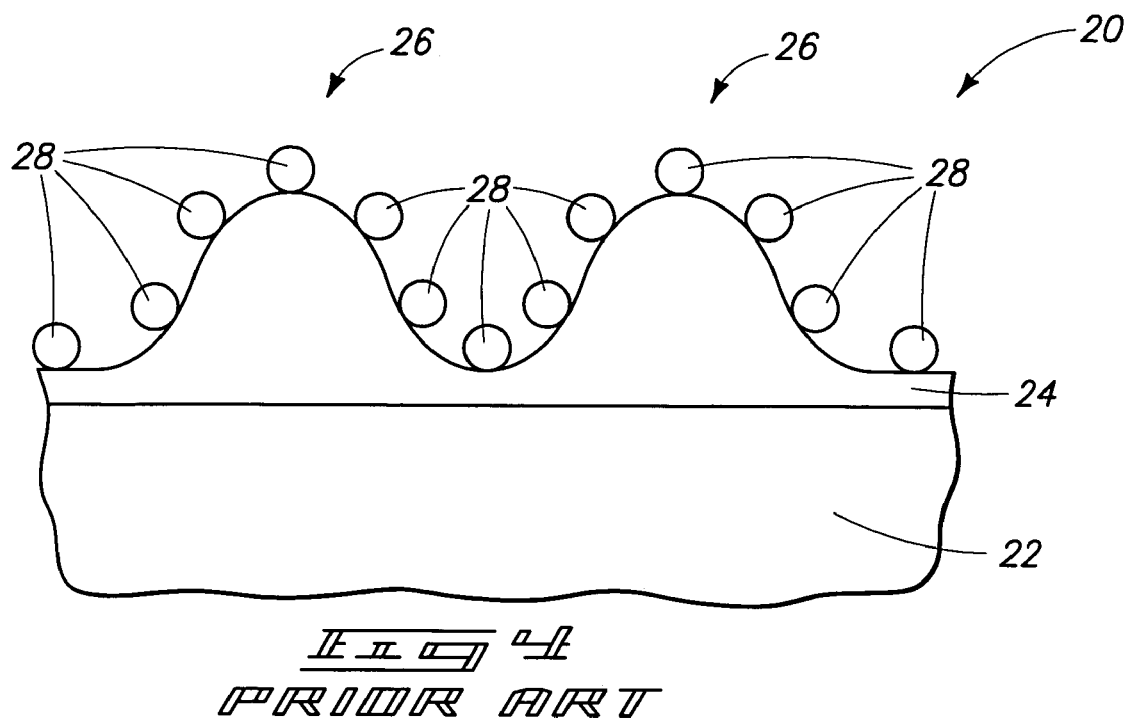
_Fig 4_
_PRIOR ART_
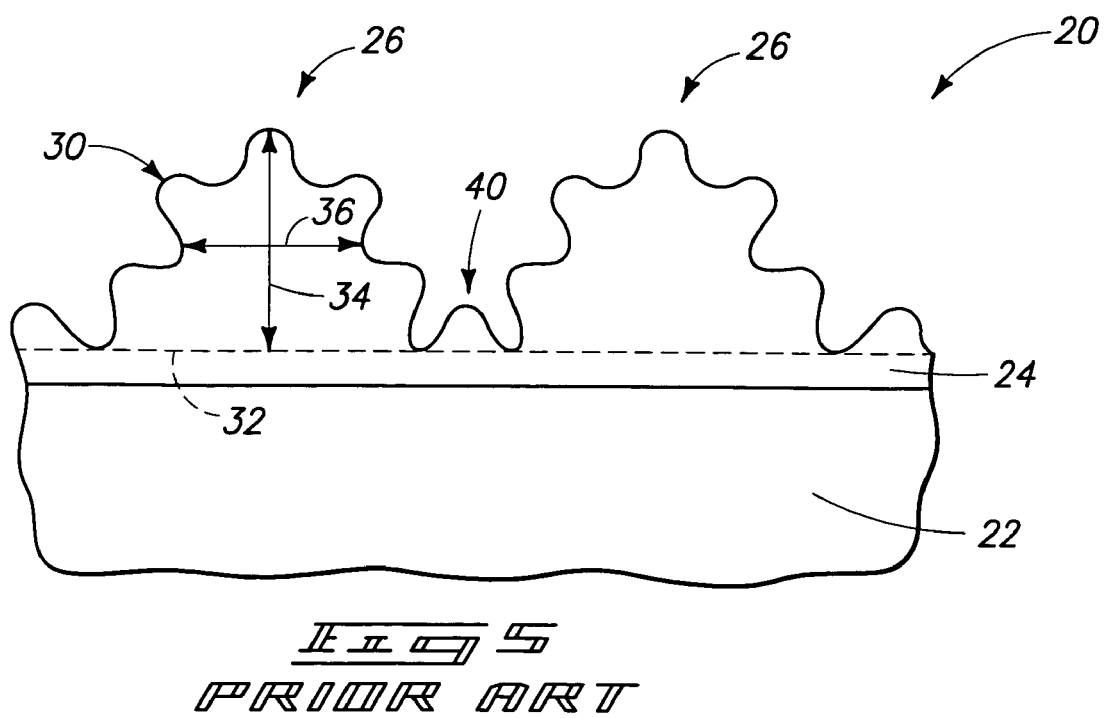
_Fig 5_
_PRIOR ART_

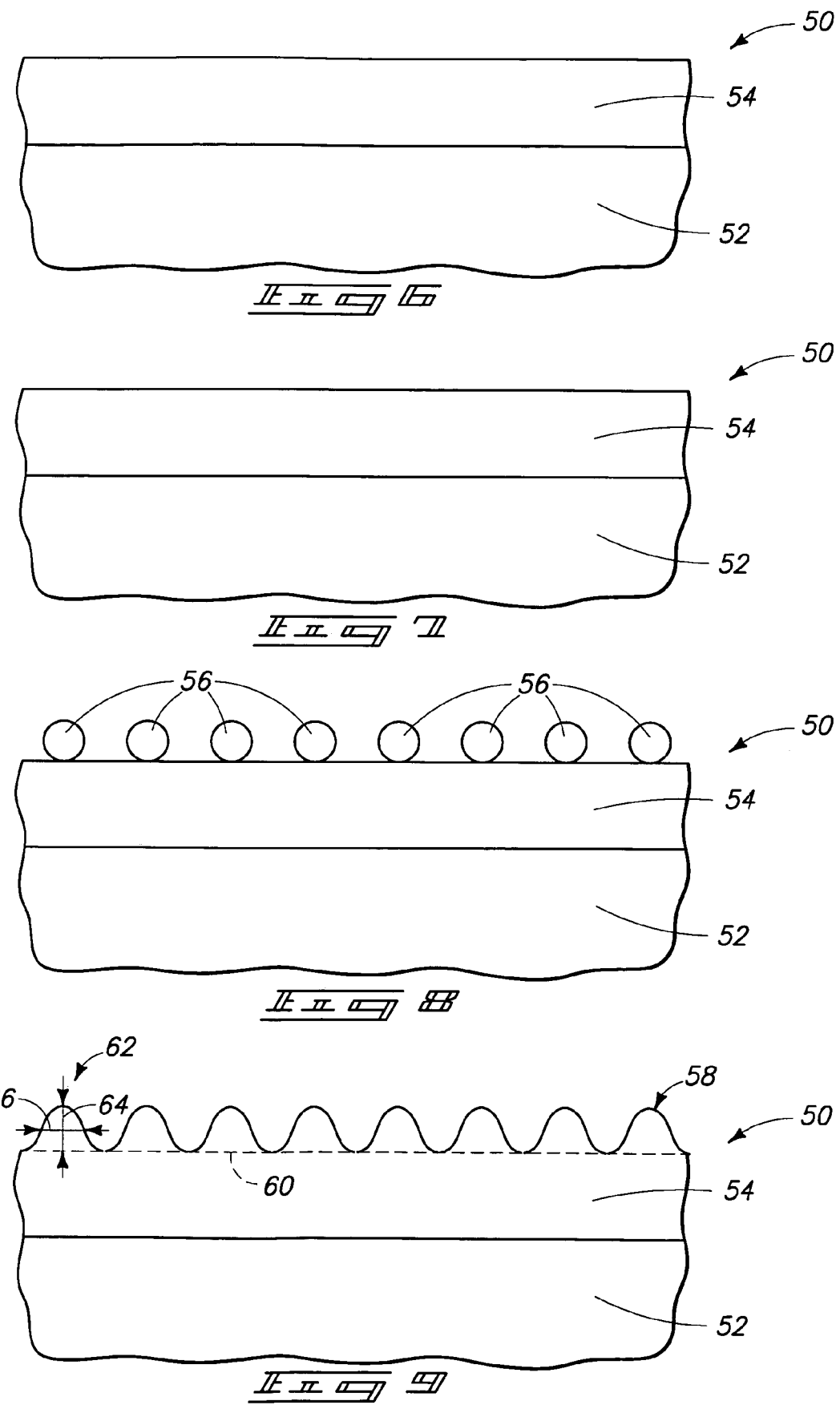

CAPACITOR CONSTRUCTIONS AND RUGGED SILICON-CONTAINING SURFACES

RELATED PATENT DATA

This patent resulted from a divisional application of U.S. patent application Ser. No. 10/655,654, which was filed Sep. 5. 2003 now U.S. Pat. No. 6,887,755.

TECHNICAL FIELD

The invention pertains to methods of forming rugged silicon-containing surfaces, and to the surfaces themselves. In particular aspects, the invention pertains to constructions comprising rugged silicon-containing surfaces, such as for example, capacitor constructions.

BACKGROUND OF THE INVENTION

Rugged silicon-containing surfaces are utilized in numerous semiconductor constructions. For instances, rugged silicon-containing surfaces are frequently utilized as storage nodes of capacitor constructions. The rugged surfaces can increase a surface area of the storage node, and thereby can increase the amount of capacitance per unit surface area of the storage node relative to a non-rugged surface. An exemplary form of rugged silicon is hemispherical grain (HSG) silicon.

Difficulties are encountered in controlling the roughness of a rugged silicon-containing surface. FIGS. 1-5 describe an exemplary prior art process for forming a rugged silicon-containing surface, and also describe a potential source of the difficulty in controlling roughness of the rugged surface.

Referring initially to FIG. 1, a graph 10 is provided to show the typical temperature control utilized in forming a rugged silicon surface. An amorphous silicon layer is formed over a substrate at an initial temperature $T_1$. Such initial temperature will typically be from about 480° C. to about 520° C. The formation of the amorphous silicon corresponds to step 12 in the graph of FIG. 1.

The amorphous silicon is subsequently heated to a second temperature $T_2$, which is typically from about 560° C. to about 620° C., and can be from about 580° C. to about 620° C. The heating of the substrate is illustrated by a ramp 14 in the graph of FIG. 1.

After the substrate reaches the temperature $T_2$, it is exposed to silane to form seed crystals, and subsequently is annealed to form the rugged silicon-containing surface. The silane exposure and annealing both typically occur at the temperature $T_2$, and would occur during the step 16 of FIG. 1.

Referring to FIG. 2, a semiconductor wafer construction 20 is illustrated at the processing stage 12 of the FIG. 1 graph. Specifically, construction 20 comprises a substrate 22 and a layer of amorphous silicon 24 over such substrate. Substrate 22 can comprise, for example, monocrystalline silicon. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

FIG. 3 shows the construction 20 after the temperature has been ramped in accordance with the processing stage 14 of FIG. 1. It is noted that the change in temperature has caused some flow of the amorphous silicon of layer 24, and accordingly humps 26 have formed at regions of layer 24.

FIGS. 4 and 5 illustrate construction 20 during the processing of stage 16 of FIG. 1. Specifically, FIG. 4 illustrates seeds 28 formed by exposure of layer 24 to silane, and FIG. 5 shows layer 24 after appropriate annealing to incorporate the seeds into a rugged surface 30. It is noted that the peaks 26 are significant features across the surface of layer 24 after the annealing.

A dashed line 32 is provided in FIG. 5 to approximately illustrate the base of the rugged surface of layer 24. Features associated with the rugged surface can be characterized in terms of a width at half height of such features. The height is measured relative to base 32. Accordingly, one of the features 26 is shown having a height 34. The width of such feature at half height is indicated by arrow 36. The width at half height of feature 26 would typically be very large, frequently is greater than 1000 Å, and will often even exceed 3000 Å. In contrast, a feature 40 having the primary contribution from a seed (shown as 28 in FIG. 4), rather than from a peak generated during the ramping of temperature of layer 24, will typically have a width at half height of 500 Å or less.

The large variation in feature sizes of the rugged surface of FIG. 5 can create problems in controlling the uniformity of the ruggedness of such surface. Accordingly, it would be desirable to develop new methods for forming a rugged silicon-containing surface which reduce the variation in feature size relative to the variations occurring in prior art processing.

SUMMARY OF THE INVENTION

In one aspect, the invention encompasses a method of forming a rugged silicon-containing surface. A layer comprising amorphous silicon is provided within a reaction chamber, and is at a first temperature. While the layer is within the chamber, the temperature of the layer is increased to a second temperature at least about 40° higher than the first temperature (sometimes at least about 60° C. higher than the first temperature) while flowing at least one hydrogen isotope into the chamber. The hydrogen isotope can be selected from the group consisting of H, D and T. Subsequently the layer is exposed to silane to seed the layer with seed crystals. The seeded layer is then annealed to form the rugged silicon-containing surface.

In one aspect, the invention encompasses a method in which a layer comprising amorphous silicon is initially at a temperature of less than or equal to about 520° C. The layer is exposed to X-Y while increasing the temperature to at least about 560° C. The components X and Y are isotopes of hydrogen, and can be the same as one another or different. After the temperature of the layer reaches 560° C., the layer is seeded with seed crystals. The seeded layer is then annealed to form a rugged silicon-containing surface.

In one aspect, the invention encompasses a rugged silicon-containing surface comprising a base and features extending upwardly from the base. All of the features of the surface have widths at half height of less than 1000 Å, and preferably less than or equal to about 500 Å. The rugged silicon-containing layer can be incorporated into a capacitor construction. Such capacitor construction can be part of a DRAM cell, and the DRAM cell can be incorporated into an electronic system.

BRIEF DESCRIPTION OF THE DRAWINGS

Preferred embodiments of the invention are described below with reference to the following accompanying drawings.

FIG. 4 is a view of the FIG. 2 wafer fragment shown at a prior art processing stage subsequent to FIG. 3.

FIG. 5 is a view of the FIG. 2 wafer fragment shown at a prior art processing stage subsequent to FIG. 4.

FIG. 6 is a diagrammatic, cross-sectional view of a semiconductor wafer fragment shown at a preliminary processing stage in accordance with an exemplary aspect of the present invention.

FIG. 7 is a view of the FIG. 6 wafer fragment shown at a processing stage subsequent to FIG. 6.

FIG. 8 is a view of the FIG. 6 wafer fragment shown at a processing stage subsequent to FIG. 7.

FIG. 9 is a view of the FIG. 6 wafer fragment shown at a processing stage subsequent to FIG. 8.

DETAILED DESCRIPTION OF THE PREFERRED EMBODIMENTS

Figure 1:
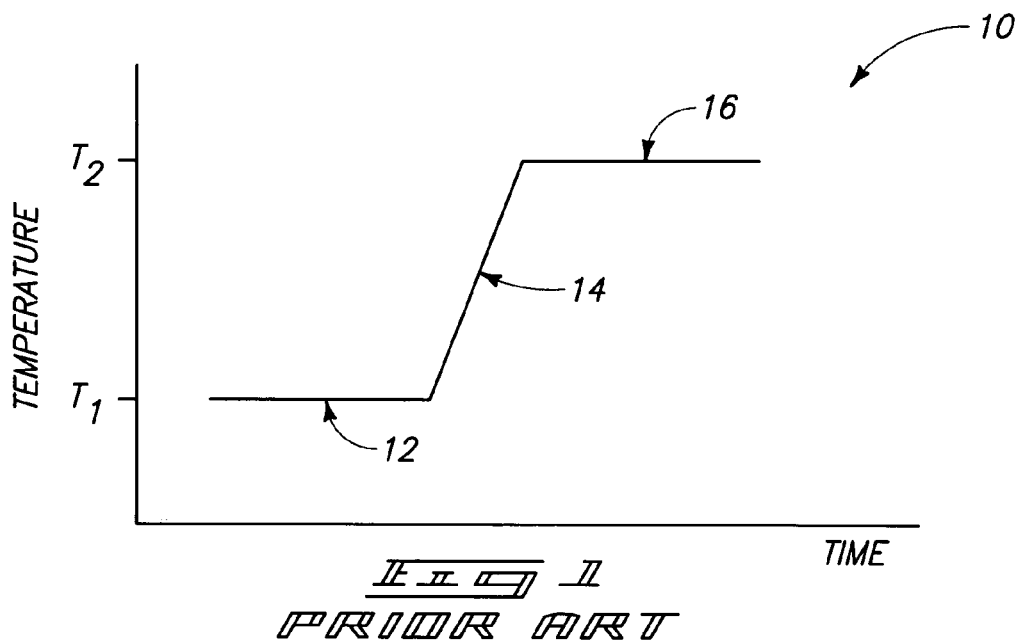
FIG. 1 shows a graph of temperature versus time for a prior art process of forming a rugged silicon-containing surface.

This disclosure of the invention is submitted in furtherance of the constitutional purposes of the U.S. Patent Laws "to promote the progress of science and useful arts" (Article 1, Section 8).

A particular aspect of the invention pertains to a process which can be utilized to form a rugged silicon-containing surface (such as, for example, a surface comprising hemispherical grain potysilicon) having uniformly small grains across its entirety. Constructions formed in accordance with such aspect can be utilized with 0.1micrometer DRAM processes, and below. The methodology of the present invention encompasses exposure of amorphous silicon to a hydrogen isotope (typically provided by hydrogen or deuterium gas) during formation of rugged silicon. An exemplary aspect of the invention is described next with reference to FIGS. 6-9.

Referring to FIG. 6, a construction 50 is illustrated at a preliminary processing stage of a method of the present invention. Construction 50 comprises a substrate 52 having a layer 54 provided thereover. Substrate 52 can be identical to the substrate 22 described above with reference to prior art FIG. 2, and layer 54 can be identical to the layer 24 described above with reference to FIG. 2. In particular aspects, layer 54 can comprise, consist essentially of, or consist of amorphous silicon. Layer 54 can be doped with conductivity-enhancing dopant at the processing stage of FIG. 6, or can be undoped. If layer 54 is doped, the layer can comprise, consist essentially of, or consist of doped amorphous silicon. The processing stage of FIG. 6 can correspond to the stage 12 of the FIG. 1 process. Accordingly, layer 54 can be at the first temperature ($T_1$) of FIG. 1, which, as discussed above, can be a temperature of from about 480° C. to about 520° C. Fragment 50 will typically be provided within a reaction chamber at the processing stage of FIG. 6.

Figure 2:
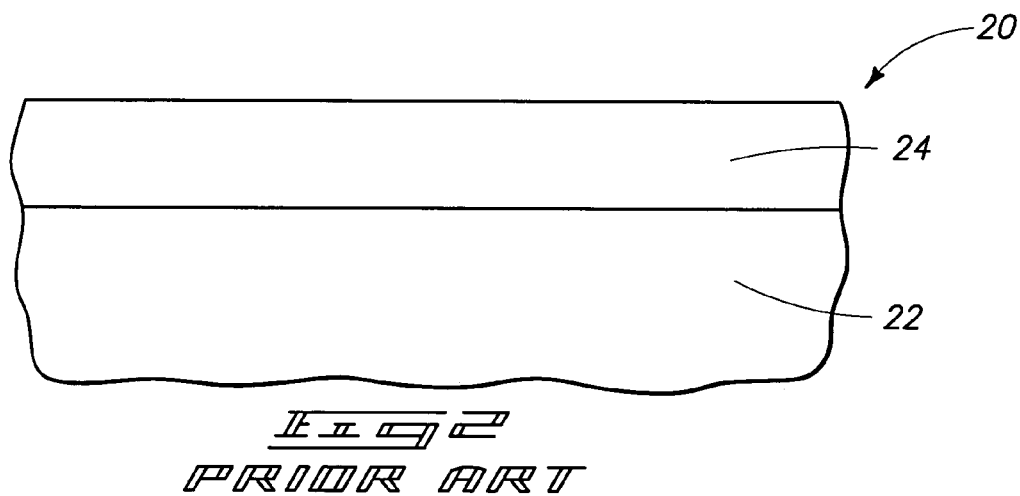
FIG. 2 is a diagrammatic, cross-sectional view of a semiconductor wafer fragment shown at a preliminary stage of a prior art process of forming a rugged silicon-containing surface.

Referring to FIG. 7, fragment 50 is shown after a temperature of layer 54 has been ramped to the second temperature ($T_2$) of FIG. 1. Accordingly, a temperature of layer 54 has been elevated by at least 40° relative to the temperature at the processing stage of FIG. 6 (in some instance the temperature is elevated by at least 60° C. relative to the processing stage of FIG. 6), with the temperature of layer 54 at the processing stage of FIG. 7 (i.e., temperature $T_2$) typically being from about 560° C. to about 620° C., and sometimes being from about 580° C. to about 620° C.

A difference between the processing of the present invention and that of the prior art (described in the "Background" section of the disclosure) is that layer 54 is exposed to at least one hydrogen isotope as the temperature of layer 54 is increased from $T_1$ to $T_2$ in accordance with an aspect of the present invention, whereas the prior art methods did not expose the amorphous silicon layer to a hydrogen isotope during the increase in temperature. The increase in temperature typically occurs in a reaction chamber, and the at least one hydrogen isotope is flowed into the chamber as the temperature is increased. The hydrogen isotope can be selected from the group consisting of H (hydrogen), D (deuterium) and T (tritium); and typically will comprise H and/or D. The hydrogen isotope can be flowed into the reaction chamber as one or more of $H_2$, H-D and $D_2$. In other words, layer 54 can be exposed to X-Y while the temperature of the layer is increased, where X and Y are isotopes of hydrogen and can be the same as one another or different. In particular aspects, X-Y will predominantly comprise $H_2$ within the reaction chamber, and in other aspects H-Y will predominantly comprise $D_2$ (with the term "predominantly comprising" indicating that more than half of the X-Y in the chamber is the identified constituent).

If the hydrogen-containing isotope is provided within the reaction chamber by flowing one or more of $H_2$, H-D and $D_2$ into the reaction chamber within a gas; the gas can comprise, consist essentially or, or consist of, one or more of $H_2$, H-D and $D_2$. If the gas consists essentially of, or consists of, one or more of $H_2$, H-D and $D_2$, the flow rate of the gas into the chamber can be from about 10 standard cubic centimeters per minute (sccm) to about one standard liter per minute (slm), with a pressure within the chamber typically being from about 10 mTorr to about 1 Torr.

Figure 3:
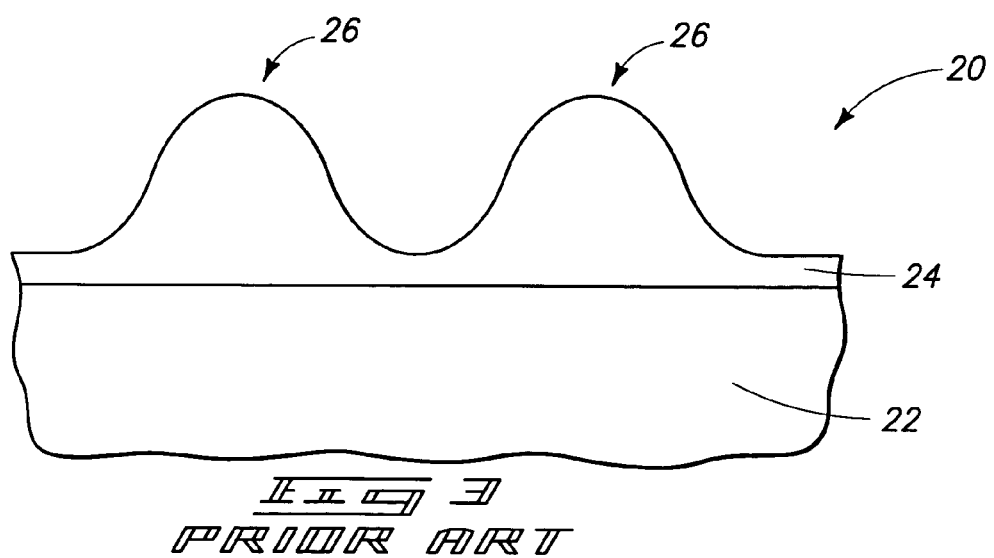
FIG. 3 is a view of the FIG. 2 wafer fragment shown at a prior art processing stage subsequent to FIG. 2.

The hydrogen isotope within the chamber can alleviate formation of peaks across a surface of silicon layer 54 during ramping of the temperature of the silicon layer from $T_1$ to $T_2$ (FIG. 1). Accordingly, the construction 50 shown on FIG. 7 differs from the prior art construction 20 of FIG. 3 in that construction 50 lacks the peaks (26 of FIG. 3) associated with the amorphous silicon layer, even though construction 50 is shown at the same processing stage in FIG. 7 as is the prior art construction 20 in FIG. 3.

A possible mechanism by which hydrogen isotopes can alleviate formation of peaks across the surface of an amorphous silicon-containing layer during an increase in temperature is through alleviation of stress on a surface of the layer. Specifically, the hydrogen isotopes can attach to silicon dangling bonds associated with the surface of the layer and thereby release stress of defect sites on the surface during the heating of the surface. Additionally, the hydrogen isotopes can combine with silicon radicals (such as, for example, $SiH_3$, $SiH_2$, SiH and Si radicals) which may degas from reaction chamber sidewalls during the heating of the interior of the reaction chamber which occurs during elevation of the temperature within the chamber. The possible mechanisms are provided herein to assist the reader in understanding the invention, and are not to limit the invention. Accordingly, the invention is not to be understood as being limited to any particular mechanism provided herein, except to the extent that such mechanism is explicitly recited in the claims which follow.

Referring to FIG. 8, silicon-containing seeds 56 are formed. Such can be formed by exposing layer 54 to silane while the layer remains at a temperature of from about 560° C. to about 620° C. The flow of hydrogen isotope within the reaction chamber can be maintained during the formation of seeds 56. Alternatively the flow of hydrogen isotope can be reduced, and in particular aspects is ceased (i.e., reduced to 0 sccm), prior to the initiation of the seeding.

In aspects which the hydrogen isotope flow is continued during the formation of seeds 56, the hydrogen isotope can be utilized to modify the shape and density of the seeds by adjustment of the amount of hydrogen isotope within the chamber relative to other materials (such as, for example, silane gas) and also by adjustment of pressure within the chamber. Accordingly, the hydrogen isotope flow can provide a parameter which can be utilized for manipulating surface properties of a rugged silicon-containing surface.

Referring to FIG. 9, construction 50 is subjected to annealing after the formation of seeds 56 (FIG. 8) to form a rugged surface 58. The annealing is conducted at a temperature of, for example, from about 560° C. to about 620° C., or in other words, it is conducted while the temperature of layer 54 is maintained at $T_2$ (FIG. 1).

The flow of hydrogen isotope can be stopped prior to the annealing, or maintained during the annealing. For instance, if the flow of hydrogen isotope is stopped prior to the seeding of FIG. 8, such flow will typically remain stopped during the annealing. If the flow of hydrogen isotope has been maintained during the seeding of FIG. 8, the flow can continue to be maintained during the annealing. Alternatively, the flow can be reduced prior to the annealing, and in particular aspects can be stopped prior to the annealing so that the annealing takes place in the absence of the hydrogen isotope.

The rugged surface 58 is more uniform in feature size than the rugged surface 30 of prior art construction 20 shown in FIG. 5. Specifically, if a base of surface 58 is defined to extend along a location at about the lowermost regions of the features (with the base being diagrammatically illustrated in FIG. 9 by dashed line 60), then the sizes of the features can be described by a width at one-half height of the features. An exemplary feature is labeled as 62. A height of the feature (as measured from base 60) is designated by 64 and a width of the feature at one-half height is designated by 66. Methodology of the present invention can form a surface in which all of the features of the surface have widths at half height less than 1000 Å, and in particular aspects can form surfaces in which all of the features of the surface have widths at half height of less than or equal to about 500 Å. Accordingly, the features associated with a surface formed in accordance with the present invention can be substantially more uniform than those formed utilizing prior art processes.

Figure 10:
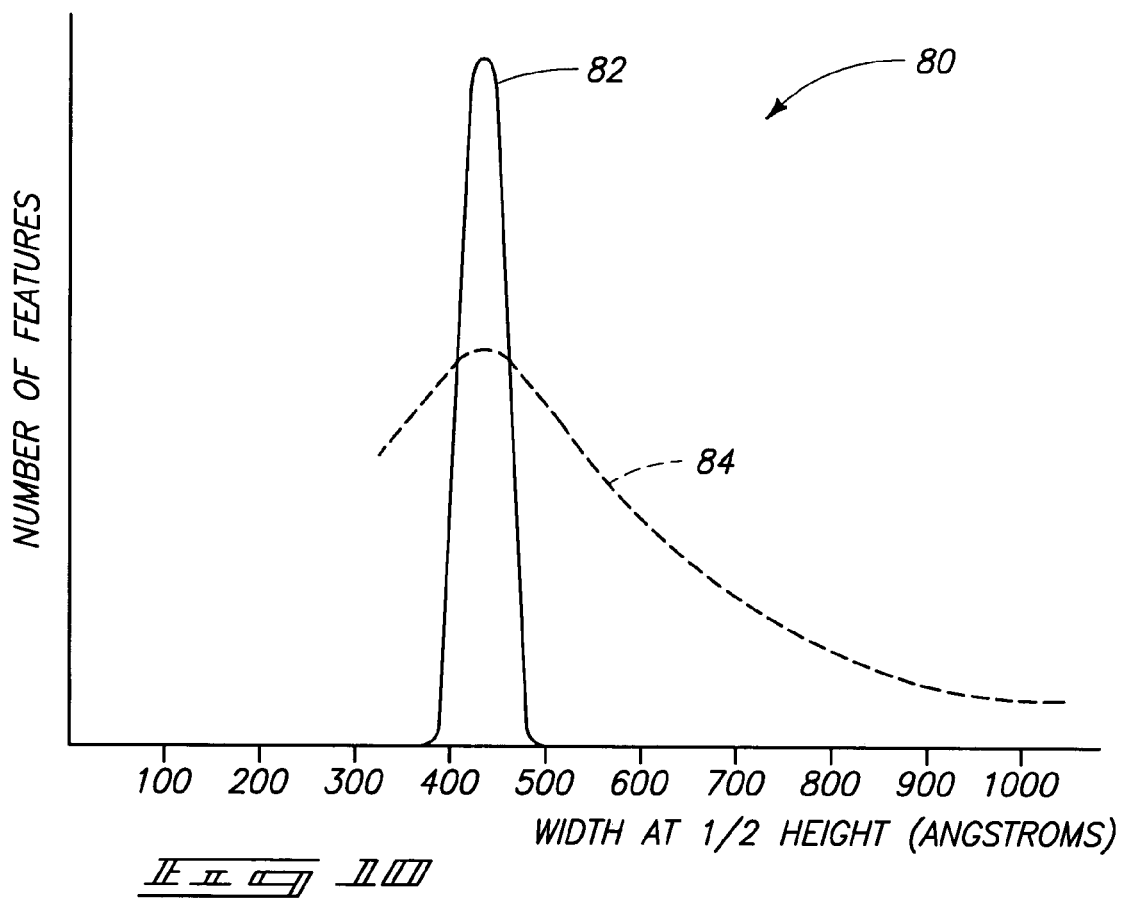
FIG. 10 shows a graph of the "number of features" versus the "width at one-half height" comparing a rugged silicon-containing surface formed in accordance with a method of the present invention (solid line) with a surface formed in accordance with prior art methodologies (dashed line). The relative sizes and shapes of the curves illustrated in FIG. 10 are for diagrammatic purposes only, and are not shown with quantitative precision, except that the graph correctly illustrates that a surface can be formed with a process of the present invention to have no features with a width at half height greater than 500 Å, while surfaces formed in accordance with prior art processes have some features with widths at one-half height larger than 1000 Å.

A comparison of a surface formed in accordance with methodology of the present invention to a surface formed in accordance with prior art methodology is provided in the graphical illustration 80 of FIG. 10. Specifically, the graph 80 compares the number of features associated with a surface to the width at half height of such features for a surface formed in accordance with an aspect of the present invention (the curve 82 shown with a solid line) and a surface formed in accordance with prior art methodologies (the curve 84 shown with a dashed line). The surface formed in accordance with methodology of the present invention has a relatively tight distribution of feature dimensions and has no features with a width at half height greater than about 500 Å. In contrast, the surface formed in accordance with prior art methodologies has a significant number of features with a width at half height greater than 1000 Å, and will typically even have features with a width at half height greater than 3000 Å (not shown on the graph of FIG. 10). Accordingly, methodology of the present invention has significantly improved the uniformity of a rugged silicon-containing surface relative to surfaces formed utilizing prior art methodologies.

Figure 11:
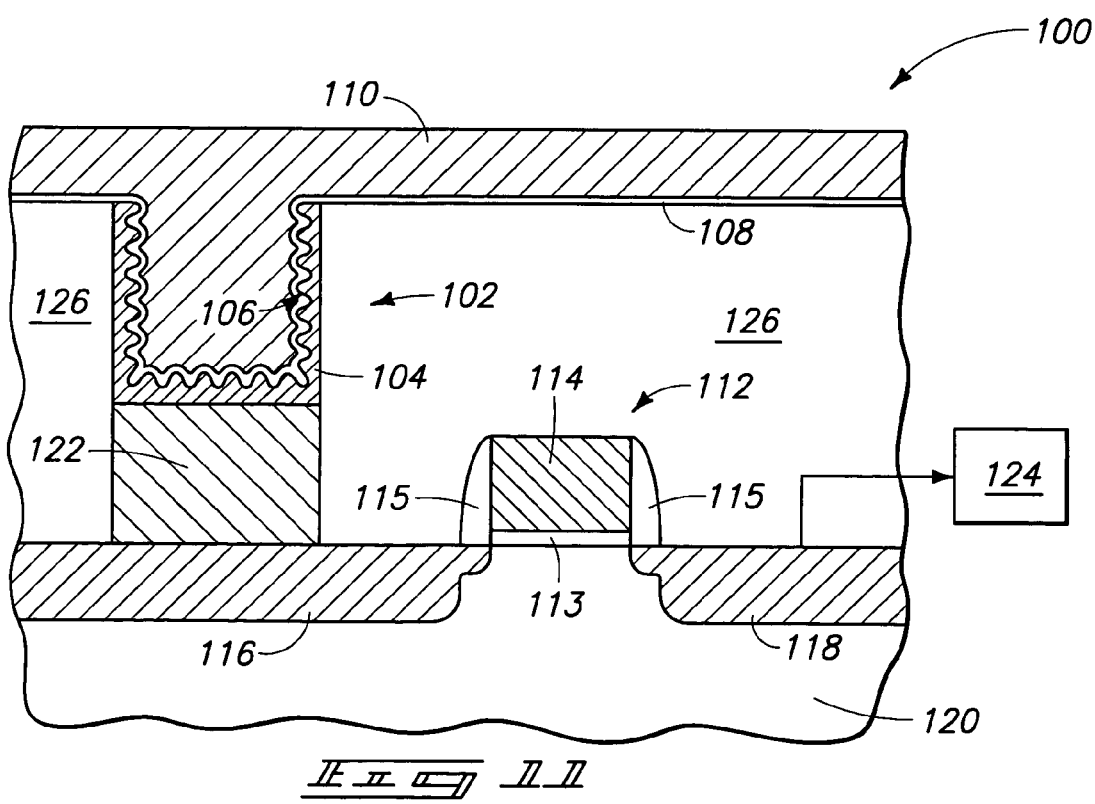
FIG. 11 is a diagrammatic, cross-sectional view of a semiconductor wafer fragment illustrating an exemplary DRAM cell formed in accordance with an aspect of the present invention.

Rugged silicon-containing surfaces formed in accordance with methodology of the present invention can be utilized in numerous constructions, such as, for example, capacitor constructions. FIG. 11 illustrates a structure 100 comprising a capacitor construction 102 having an electrode 104 with a rugged silicon-containing surface 106. Such surface can be formed in accordance with methodology of the present invention. The electrode 104 is shown as a storage node electrode. Capacitor 102 further comprises a dielectric material 108 and a second capacitor electrode 110 spaced from the storage node 104 by dielectric material 108.

Storage node 104 can comprise, consist essentially of, or consist of conductively-doped silicon. The doping of storage node 104 can occur before or after formation of rugged surface 106. Specifically, dopant can be implanted into the rugged surface after the annealing described above with reference to FIG. 9, and/or the dopant can be provided within material 54 prior to formation of the rugged surface. Also, the substrate 52 of FIG. 9 can comprise conductively-droped silicon, and layer 54 can be doped by out-diffusion of conductivity-enhancing dopant from layer 52 into layer 54. In particular aspects of the invention, layer 52 will comprise conductively-doped polycrystalline silicon, layer 54 will comprise undoped amorphous silicon, and layer 54 will be doped by implanting conductivity-enhancing dopant into the layer after the annealing of FIG. 9.

The capacitor construction 102 is shown incorporated into a DRAM cell. Specifically, assembly 100 comprises a transistor 112 which includes a gate 114 and source/drain regions 116 and 118. Although gate 114 is shown to be entirely formed of conductive material, it is to be understood that gate 114 can be formed of numerous layers, and such layers can include an insulative material cap (not shown).

The source/drain regions are shown as diffusion regions formed within a semiconductive substrate 120. Substrate 120 can comprise, for example, monocrystalline silicon. A conductive pedestal 122 extends from source/drain region 116 to storage node 104 to connect the storage node with the source/drain region. Conductive pedestal can comprise, for example, metal and/or conductivetly-doped silicon. The source/drain region 118 is connected to a bitline 124 through a suitable connection.

Transistor 112 is shown to comprise a gate oxide 113 separating gate 114 from substrate 120, and to further comprise sidewall spacers 115 along sidewall edges of the gate. Sidewall spacers 115 can comprise, for example, silicon dioxide and/or silicon nitride, and gate oxide 113 can comprise, for example, silicon dioxide.

An insulative material 126 extends over and around transistor 112. Insulative material 126 can comprise, for example, borophosphosilicate glass.

Utilization of the rugged silicon surface formed in accordance with methodology of the present invention within a DRAM cell can advantageously improve uniformity of the rugged silicon-containing surface relative to prior art silicon-containing surfaces. Such can allow better control of capacitive characteristics of the capacitor of the DRAM cell, which can improve performance characteristics across an array of DRAM cells.

A circuit device comprising rugged semiconductor material formed in accordance with methodology of the present invention (such as the above-described DRAM cell) can be utilized in numerous assemblies, including, for example, computer systems and other electronic systems.

Figure 12:
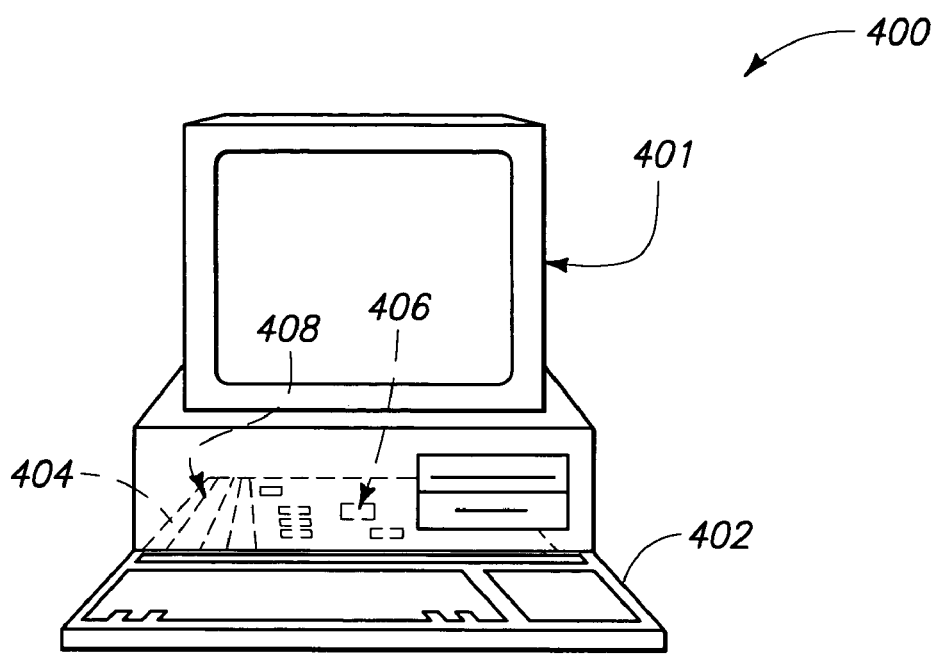
FIG. 12 is a diagrammatic view of a computer illustrating an exemplary application of the present invention.
Figure 13:
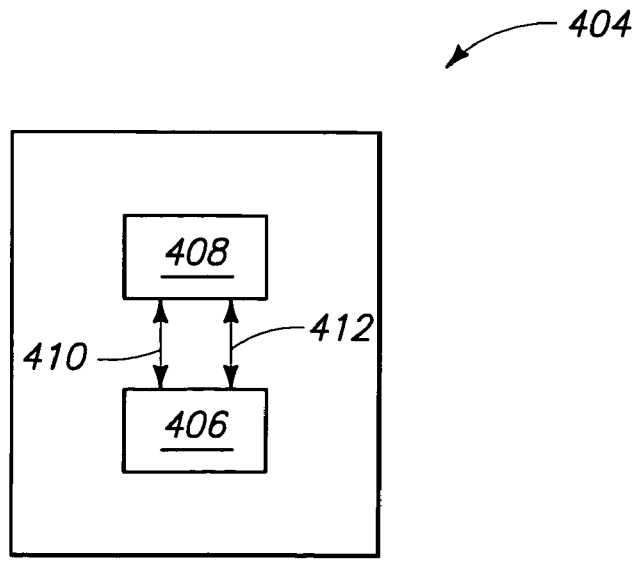
FIG. 13 is a block diagram showing particular features of the motherboard of the FIG. 12 computer.

FIG. 12 illustrates generally, by way of example, but not by way of limitation, an embodiment of a computer system 400 according to an aspect of the present invention. Computer system 400 includes a monitor 401 or other communication output device, a keyboard 402 or other communication input device, and a motherboard 404. Motherboard 404 can carry a microprocessor 406 or other data processing unit, and at least one memory device 408. Memory device 408 can comprise various aspects of the invention described above, including, for example, the DRAM unit cell described with reference to FIG. 11. Memory device 408 can comprise an array of memory cells, and such array can be coupled with addressing circuitry for accessing individual memory cells in the array. Further, the memory cell array can be coupled to a read circuit for reading data from the memory cells. The addressing and read circuitry can be utilized for conveying information between memory device 408 and processor 406. Such is illustrated in the block diagram of the motherboard 404 shown in FIG. 13. In such block diagram, the addressing circuitry is illustrated as 410 and the read circuitry is illustrated as 412.

In particular aspects of the invention, memory device 408 can correspond to a memory module. For example, single in-line memory modules (SIMMs) and dual in-line memory modules (DIMMs) may be used in the implementation which utilizes the teachings of the present invention. The memory device can be incorporated into any of a variety of designs which provide different methods of reading from and writing to memory cells of the device. One such method is the page mode operation. Page mode operations in a DRAM are defined by the method of accessing a row of a memory cell arrays and randomly accessing different columns of the array. Data stored at the row and column intersection can be read and output while that column is accessed.

An alternate type of device is the extended data output (EDO) memory which allows data stored at a memory array address to be available as output after the addressed column has been closed. This memory can increase some communication speeds by allowing shorter access signals without reducing the time in which memory output data is available on a memory bus. Other alternative types of devices include SDRAM, DDR SDRAM, SLDRAM, VRAM and Direct RDRAM, as well as others such as SRAM or Flash memories.

Figure 14:
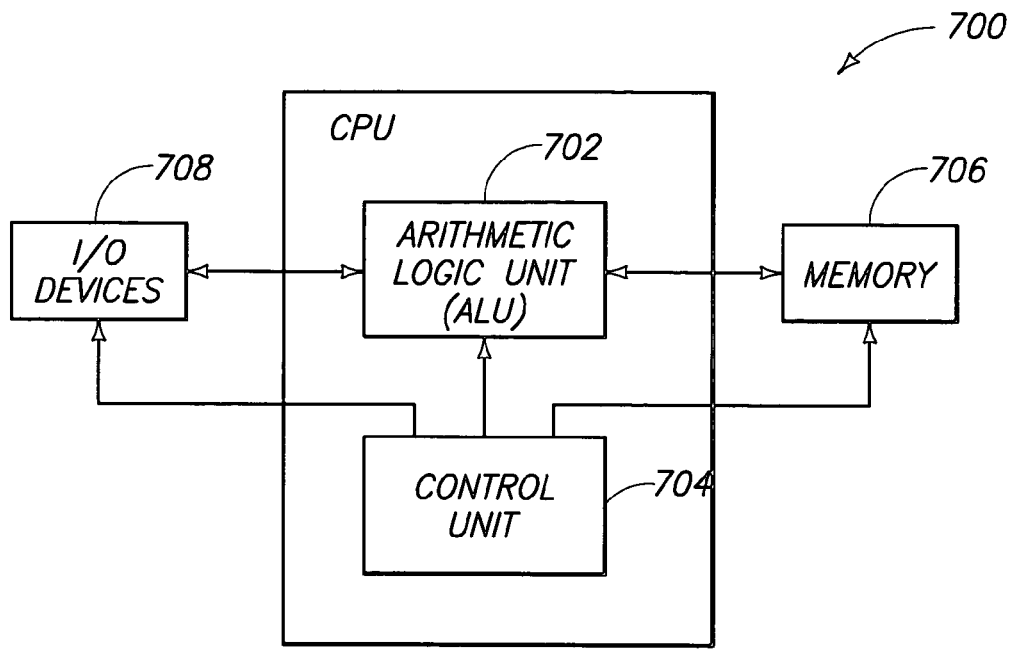
FIG. 14 is a high-level block diagram of an electronic system according to an exemplary aspect of the present invention.

FIG. 14 illustrates a simplified block diagram of a high-level organization of various embodiments of an exemplary electronic system 700 of the present invention. System 700 can correspond to, for example, a computer system, a process control system, or any other system that employs a processor and associated memory. Electronic system 700 has functional elements, including a processor or arithmetic/logic unit (ALU) 702, a control unit 704, a memory device unit 706 and an input/output (I/O) device 708. Generally, electronic system 700 will have a native set of instructions that specify operations to be performed on data by the processor 702 and other interactions between the processor 702, the memory device unit 706 and the I/O devices 708. The control unit 704 coordinates all operations of the processor 702, the memory device 706 and the I/O devices 708 by continuously cycling through a set of operations that cause instructions to be fetched from the memory device 706 and executed. In various embodiments, the memory device 706 includes, but is not limited to, random access memory (RAM) devices, read-only memory (ROM) devices, and peripheral devices such as a floppy disk drive and a compact disk CD-ROM drive. One of ordinary skill in the art will understand, upon reading and comprehending this disclosure, that any of the illustrated electrical components are capable of being fabricated to include DRAM cells in accordance with various aspects of the present invention.

Figure 15:
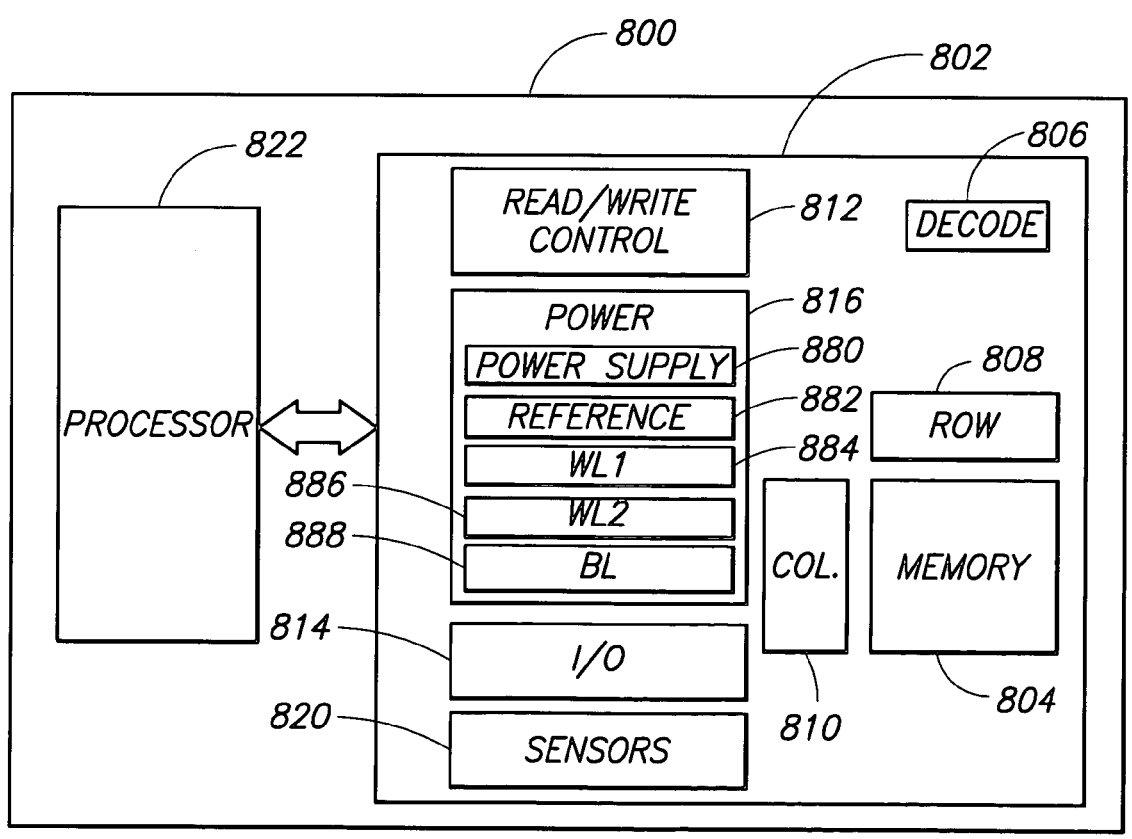
FIG. 15 is a simplified block diagram of an exemplary electronic system according to an aspect of the present invention.

FIG. 15 is a simplified block diagram of a high-level organization of various embodiments of an exemplary electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing the first wordline with pulses, circuitry 886 for providing the second wordline with pulses, and circuitry 888 for providing the bitline with pulses. The system 800 also includes a processor 822, or memory controller for memory accessing.

The memory device 802 receives control signals 824 from the processor 822 over wiring or metallization lines. The memory device 802 is used to store data which is accessed via I/O lines. It will be appreciated by those skilled in the art that additional circuitry and control signals can be provided, and that the memory device 802 has been simplified to help focus on the invention. At least one of the processor 822 or memory device 802 can include a DRAM cell of the type described previously in this disclosure.

The various illustrated systems of this disclosure are intended to provide a general understanding of various applications for the circuitry and structures of the present invention, and are not intended to serve as a complete description of all the elements and features of an electronic system using memory cells in accordance with aspects of the present invention. One of ordinary skill in the art will understand that the various electronic systems can be fabricated in single-package processing units, or even on a single semiconductor chip, in order to reduce the communication time between the processor and the memory device(s).

Applications for memory cells can include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A capacitor, comprising:

a first electrode, the first electrode comprising a rugged silicon-containing surface having a base and substantially conical hills extending upwardly from the base, all of the hills having widths at half height of less than or equal to about 500 Å;

a dielectric material over the rugged silicon-containing surface; and a second electrode spaced from the first electrode by at least the dielectric material;

wherein the rugged silicon-containing surface consists of doped amorphous silicon, the surface having been exposed to at least one hydrogen isotope in a reaction chamber prior to being seeded with seed crystals used to form the rugged silicon-containing surface.

2. The capacitor of claim 1 wherein the dielectric material physically contacts the surface.

3. The capacitor of claim 1 wherein the first electrode is comprised by a storage node of the capacitor.

4. A DRAM cell comprising the capacitor of claim 1.

5. An electronic system comprising the DRAM cell of claim 4.

* * * * *